(12) United States Patent
Liu et al.

(10) Patent No.: US 10,726,784 B2
(45) Date of Patent: Jul. 28, 2020

(54) OLED DISPLAY DEVICE AND LUMINANCE ADJUSTMENT METHOD THEREOF, AND CONTROLLER THEREOF

(71) Applicant: BOE TECHNOLOGY GROUP CO., LTD., Beijing (CN)

(72) Inventors: Dongni Liu, Beijing (CN); Zheng Fang, Beijing (CN); Xiaochuan Chen, Beijing (CN); Shengji Yang, Beijing (CN); Jie Fu, Beijing (CN); Han Yue, Beijing (CN); Li Xiao, Beijing (CN); Lei Wang, Beijing (CN); Pengcheng Lu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 116 days.

(21) Appl. No.: 15/771,069

(22) PCT Filed: Sep. 29, 2017

(86) PCT No.: PCT/CN2017/104322
§ 371 (c)(1),
(2) Date: Apr. 25, 2018

(87) PCT Pub. No.: WO2018/176777
PCT Pub. Date: Oct. 4, 2018

(65) Prior Publication Data
US 2019/0057657 A1    Feb. 21, 2019

(30) Foreign Application Priority Data

Mar. 28, 2017 (CN) .......................... 2017 1 0196207

(51) Int. Cl.
*G09G 3/3258* (2016.01)
*H01L 27/32* (2006.01)
(Continued)

(52) U.S. Cl.
CPC ......... *G09G 3/3258* (2013.01); *G09G 3/3208* (2013.01); *H01L 27/3227* (2013.01);
(Continued)

(58) Field of Classification Search
CPC ......... G09G 3/3258; G09G 2320/0233; G09G 2320/0646; G09G 2360/141;
(Continued)

(56) References Cited

U.S. PATENT DOCUMENTS 7,994,517 B2 * 8/2011 Yang .................. H01L 27/3269
257/72
2007/0138951 A1 6/2007 Park et al.
(Continued)

FOREIGN PATENT DOCUMENTS

CN 1353410 A 6/2002
CN 1541040 A 10/2004
(Continued)

OTHER PUBLICATIONS

Notification of the First Office Action issued in Chinese Patent Application No. 201710196207.4, dated Sep. 5, 2018; with English translation.
(Continued)

*Primary Examiner* — Amare Mengistu
*Assistant Examiner* — Crystal Mathews
(74) *Attorney, Agent, or Firm* — McDermott Will & Emery LLP

(57) ABSTRACT

An OLED display device, including a substrate, an OLED display element disposed on a display area of the substrate, at least one light-sensitive component and a controller electrically connected to at least one light-sensitive component. The controller is configured to control the OLED display element to emit light, and to perform a luminance compensation on the OLED display element according to a
(Continued)

luminance of the light emitted by the OLED display element detected by the at least one light-sensitive component.

14 Claims, 4 Drawing Sheets

(51) Int. Cl.
H01L 51/52 (2006.01)
G09G 3/3208 (2016.01)
(52) U.S. Cl.
CPC ...... H01L 27/3248 (2013.01); H01L 27/3262 (2013.01); H01L 27/3269 (2013.01); H01L 27/3276 (2013.01); H01L 51/5237 (2013.01); G09G 2320/0233 (2013.01); G09G 2320/0646 (2013.01); G09G 2320/0693 (2013.01); G09G 2360/141 (2013.01); G09G 2360/145 (2013.01); G09G 2360/147 (2013.01); H01L 2251/5315 (2013.01); H01L 2251/5323 (2013.01)
(58) Field of Classification Search
CPC ......... G09G 2360/145; H01L 21/3227; H01L 21/3248; H01L 21/3262; H01L 21/3276; H01L 51/5237; H01L 2251/5323
See application file for complete search history.

(56) References Cited

U.S. PATENT DOCUMENTS

| | | | |
|---|---|---|---|
| 2009/0225244 A1 | 9/2009 | Wang et al. | |
| 2010/0045650 A1* | 2/2010 | Fish | G09G 3/3258 |
| | | | 345/211 |
| 2013/0194199 A1* | 8/2013 | Lynch | G06F 3/0412 |
| | | | 345/173 |
| 2014/0285535 A1 | 9/2014 | Pyo | |
| 2016/0093251 A1* | 3/2016 | Chung | G09G 3/3275 |
| | | | 345/207 |
| 2016/0226030 A1 | 8/2016 | Heo | |
| 2016/0300527 A1 | 10/2016 | Piper et al. | |
| 2016/0358582 A1* | 12/2016 | Lee | G09G 5/10 |
| 2017/0200411 A1 | 7/2017 | Song et al. | |
| 2017/0365217 A1* | 12/2017 | An | G09G 3/3233 |

FOREIGN PATENT DOCUMENTS

| | | |
|---|---|---|
| CN | 101399032 A | 4/2009 |
| CN | 101526674 A | 9/2009 |
| CN | 104200782 A | 12/2014 |
| CN | 105070738 A | 11/2015 |
| CN | 105761672 A | 7/2016 |
| CN | 105845705 A | 8/2016 |
| CN | 106128358 A | 11/2016 |
| CN | 106531081 A | 3/2017 |
| CN | 106887212 A | 6/2017 |
| EP | 1 204 088 A2 | 5/2002 |
| EP | 1 467 408 A | 10/2004 |

OTHER PUBLICATIONS

English translation of International Search Report and Written Opinion issued in International Application No. PCT/CN2017/104322 dated Dec. 28, 2017.

Second Office Action issued in Chinese Patent Application No. 201710196207.4, dated Apr. 16, 2019; with English translation.

* cited by examiner

OLED DISPLAY DEVICE AND LUMINANCE ADJUSTMENT METHOD THEREOF, AND CONTROLLER THEREOF

CROSS-REFERENCE TO RELATED APPLICATION

This application is the U.S. National Phase under 35 U.S.C. § 371 of International Patent Application No. PCT/CN2017/104322, filed on Sep. 29, 2017, which in turn claims priority to Chinese Patent Application No. 201710196207.4, filed on Mar. 28, 2017, titled "OLED DISPLAY DEVICE AND LUMINANCE ADJUSTMENT METHOD THEREOF", the entire disclosures of which Applications are incorporated by reference herein.

TECHNICAL FIELD

The present disclosure relates to the display technology field, more particularly, to an OLED display device and a luminance adjustment method thereof.

BACKGROUND

OLED (Organic Light Emitting Diode) is a current-driven device, which is widely used in the field of display due to its advantages of self-luminescence, fast response, wide viewing angle, and being able to be formed on a flexible substrate, etc.

For an active-driven OLED display device, each sub-pixel includes an OLED pixel circuit in addition to the OLED.

With the development of OLED display devices toward high PPI (Pixels Per Inch), limited by the space limitations of sub-pixels, only the simplest 2T1C pixel circuit can be used to drive an OLED, and the threshold voltage compensation circuit can't be used. Therefore, the threshold voltage may be shifted, leading uneven luminance and poor display effect of the OLED.

SUMMARY

In one aspect, an OLED display device is provided, including a substrate, an OLED display element disposed on a display area of the substrate, at least one light-sensitive component and a controller electrically connected to the at least one light-sensitive component; wherein, the controller is configured to control the OLED display element to emit light, and to perform a luminance compensation on the OLED display element according to a luminance of the light, which is emitted by the OLED display element, detected by the at least one light-sensitive component.

Optionally, the at least one light-sensitive component includes a plurality of light-sensitive components which corresponding to different regions of the display area respectively.

Optionally, the at least one light-sensitive component is disposed on at least one light emitting side of the OLED display element.

Further optionally, the at least one light-sensitive component is light transmissive.

Or, optionally, the OLED display element is a double-sided light emitting display element; the at least one light-sensitive component is disposed on one of the at least one light emitting side of the OLED display element, and the at least one light-sensitive component is not light transmissive.

Optionally, the OLED display device further includes a package substrate disposed on a side of the OLED display element away from the substrate; the at least one light-sensitive component is disposed on the package substrate when the at least one light-sensitive component is disposed on the side of the OLED display element away from the substrate; the at least one light-sensitive component is disposed on a side of the substrate away from the OLED display element when the at least one light-sensitive component is disposed on a side of the OLED display element away from the package substrate.

Based on the above, optionally, each of the at least one light-sensitive component is a photodiode.

Optionally, the OLED display device further includes a switching thin film transistor and a driving thin film transistor both disposed between the substrate and the OLED display element; wherein, a gate of the switching thin film transistor is electrically connected to a gate line, a source of the switching thin film transistor is electrically connected to a data line, and a drain of the switching thin film transistor is electrically connected to a gate of the driving thin film transistor; and a drain of the driving thin film transistor is electrically connected to an anode of the OLED display element.

In another aspect, a luminance adjustment method of an OLED display device is provided. The luminance adjustment method of the OLED display device includes: a step of detecting, wherein, a controller controls an OLED display element to emit light to display an image having a preset gray scale, and obtains a compensation value for a light emitting luminance of the OLED display element according to a current luminance of the light emitted by the OLED display element under displaying the image having the preset gray scale, and the current luminance is detected by at least one light-sensitive component; a step of compensating, wherein, the controller performs a luminance compensation on the OLED display element according to the compensation value.

Optionally, the step of detecting that the controller controls the OLED display element to emit the light to display the image having the preset gray scale, and obtains the compensation value for the light emitting luminance of the OLED display element according to the current luminance of the light emitted by the OLED display element under displaying the image having the preset gray scale, and the current luminance is detected by the at least one light-sensitive component includes: the controller controls the OLED display element to emit light to display the image having the preset gray scale; the controller receives the current luminance of the light emitted by the OLED display element under displaying the image having the preset gray scale, and the current luminance is detected by the at least one light-sensitive component; and the controller obtains a data voltage corresponding to the current luminance detected by the at least one light-sensitive component according to the current luminance, and obtains at least one compensation voltage for the light emitting luminance of the OLED display element according to a theoretical data voltage input into the OLED display element under displaying the image having the preset gray scale and the data voltage corresponding to the current luminance.

Further optionally, the at least one light-sensitive component includes a plurality of light-sensitive components and the a plurality of light-sensitive components correspond to different regions of the display area respectively, and the at least one compensation voltage includes a plurality of compensation voltages and the plurality of compensation voltages are in one-to-one correspondence with regions of a display area.

Based on this, the controller performs the luminance compensation on the OLED display element includes: the controller performs the luminance compensation on a plurality of display sub-elements of the OLED display element in any one region of the display area according to one of the plurality of compensation voltages corresponding to the region.

Optionally, a mapping table of the theoretical data voltage inputted into the OLED display element and a theoretical light emitting luminance is stored in the controller.

Based on this, the controller obtains the at least one compensation voltage for the light emitting luminance of the OLED display element according to the theoretical data voltage input into the OLED display element under displaying the image having the preset gray scale and the data voltage corresponding to the current luminance includes: the controller obtains the data voltage corresponding to the current luminance by searching the mapping table according to the current luminance detected by the at least one light-sensitive component; and the controller obtains the at least one compensation voltage for the light emitting luminance of the OLED display element by performing a difference operation according to the theoretical data voltage inputted into the OLED display element under displaying the image having the preset gray scale and the data voltage corresponding to the current luminance.

Based on the above, optionally, the image having the preset gray scale is a black image or a white image.

Optionally, the step of detecting is performed at a time of factory setting, at a time of startup or at a time of shutdown.

In another aspect, a controller of the OLED display device as described above is provided. The controller of the OLED display device includes a processor and a receiver; wherein, the processor is configured to control an OLED display element to emit light to display an image having a preset gray scale; the receiver is configured to receive a current luminance of the light emitted by the OLED display element under displaying the image having the preset gray scale, and the current luminance is detected by at least one light-sensitive component; and the processor is configured to obtain a compensation value for a light emitting luminance of the OLED display element according to the current luminance, and to perform a luminance compensation on the OLED display element according to the compensation value.

Optionally, the processor is configured to control the OLED display element to emit the light to display the image having the preset gray scale; the receiver is configured to receive the current luminance of the light emitted by the OLED display element under displaying the image having the preset gray scale, and the current luminance is detected by the at least one light-sensitive component; the processor is configured to obtain a data voltage corresponding to the current luminance received by the receiver according to the current luminance, and to obtain at least one compensation voltage for the light emitting luminance of the OLED display element according to a theoretical data voltage inputted into the OLED display element under displaying the image having the preset gray scale and the data voltage corresponding to the current luminance.

Further optionally, the at least one compensation voltage includes a plurality of compensation voltages and the a plurality of compensation voltages are in one to one correspondence with regions of a display area, when the at least one light-sensitive component includes a plurality of light-sensitive components corresponding to different regions of the display area respectively.

Basing on this, the processor is configured to perform the luminance compensation on a plurality of display sub-elements of the OLED display element in any one region of the display area according to one of the plurality of compensation voltages corresponding to the region.

Optionally, a mapping table of the theoretical data voltage inputted into the OLED display element and a theoretical light emitting luminance is stored in the processor.

Basing on this, the processor is configured to obtain the data voltage corresponding to the current luminance by searching the mapping table according to the current luminance detected by the at least one light-sensitive component; and the processor is further configured to obtain the at least one compensation voltage for the light emitting luminance of the OLED display element by performing a difference operation according to the theoretical data voltage inputted into the OLED display element under displaying the image having the preset gray scale and the data voltage corresponding to the current luminance.

Based on the above, optionally, the image having the preset gray scale is a black image or a white image.

Optionally, a step of detecting is performed at the time of factory setting, or at the time of startup or at the time of shutdown.

In yet another aspect, a non-transitory computer readable medium in which a computer programs are stored is provided. After the computer programs are loaded to a processor, a luminance adjustment method of an OLED display device as described above will be performed by the processor when the computer programs are executed by the processor.

In yet still another aspect, a computer program is provided. After the computer program is loaded to a processor, a luminance adjustment method of an OLED display device as described above will be implemented when the computer program executed by the processor.

In yet still another aspect, a computer program product is provided. After the computer program product is loaded to a processor, a luminance adjustment method of an OLED display device as described above is implemented when the computer program product executed by the processor.

BRIEF DESCRIPTION OF THE DRAWINGS

In order to describe technical solutions in embodiments of the present disclosure or in the prior art more clearly, the drawings to be used in the description of embodiments or the prior art will be introduced briefly. Obviously, the drawings to be described below are merely some embodiments of the present disclosure, and a person of ordinary skill in the art can obtain other drawings according to those drawings without paying any creative effort.

DETAILED DESCRIPTION

Figure 1:
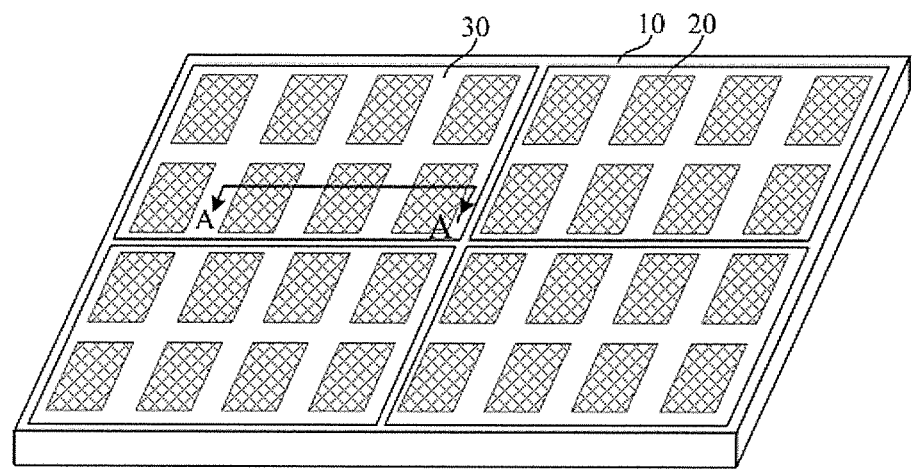
FIG. 1 is a first top view of an OLED display device according to some embodiments of the present disclosure.

The technical solutions in the embodiments of the present disclosure will be described clearly and completely with reference to the drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In order to improve the uniformity of a display luminance of an OLED display device, some embodiments of the present disclosure provide an OLED display device. As shown in FIG. 1-FIG. 7, the OLED display device includes a substrate 10, an OLED display element 20 disposed on the display area of the substrate, at least one light-sensitive component 30 and a controller 50 electrically connected to the at least one light-sensitive component 30. The controller 50 is configured to control the OLED display element 20 to emit light, and to perform a luminance compensation on the OLED display element 20 according to a luminance of the light emitted by the OLED display element 20 detected by the at least one light-sensitive component 30.

The OLED display element 20 can include an anode 201, a cathode 202 and an organic material functional layer 203 disposed between the anode 201 and the cathode 202. The organic material functional layer 203 at least includes a light emitting layer, and further includes an electron transmission layer and a hole transmission layer. On the basis of this, in order to improve an efficiency of injecting electrons and holes into the light emitting layer, the organic material functional layer 203 can also include an electron injection layer disposed between the cathode 202 and the electron transport layer, and a hole injection layer disposed between the anode 201 and the hole transport layer.

According to a difference of the structure and the material between the anode 201 and the cathode 202 in the OLED display element 20, the OLED display element 20 can be classified into a single side light emitting display element and a double-sided light emitting display element. The single side light emitting display element can also be classified into a top light emitting display element and a bottom light emitting display element.

Figure 2:
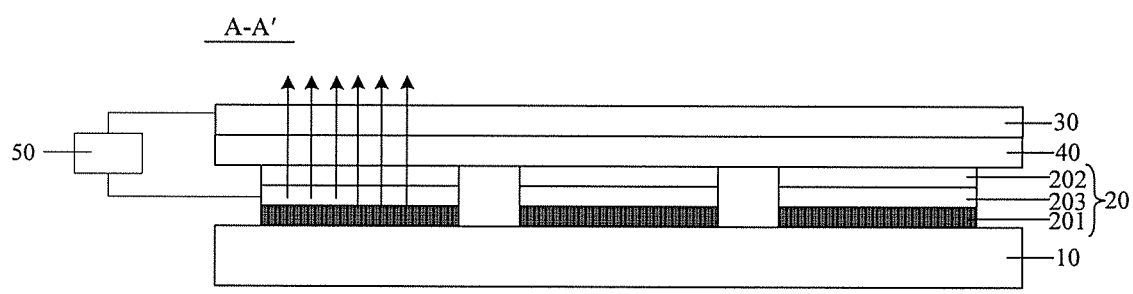
FIG. 2 is a sectional view along line AA' in FIG. 1.

Specifically, for the top light emitting display element, as shown in FIG. 2, taking a case in which the anode 201 is disposed adjacent to the substrate 10 and the cathode 202 is disposed away from the substrate 10 as an example, the anode 201 is not light transmissive, and the cathode 202 is light transmissive or semi-transmissive. In this way, a part of the light emitted from the light emitting layer of the organic material function layer 203 directly emits through the cathode 202, and another part of the light emitted from the light emitting layer of the organic material function layer 203 emits through the cathode 202 after being reflected by the anode 201.

Figure 3:
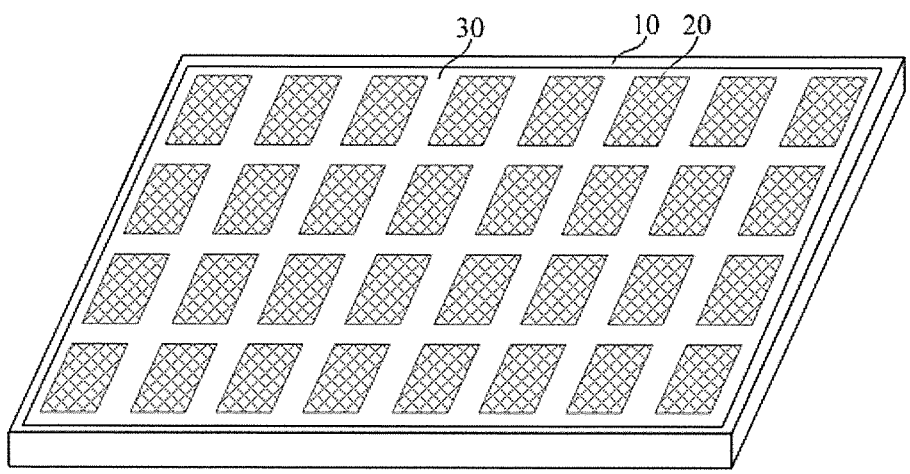
FIG. 3 is a second top view of an OLED display device according to some embodiments of the present disclosure.

In this case, the at least one light-sensitive component 30 can be disposed on one of at least one light emitting side of the OLED display element 20. Based on this, as shown in FIG. 1, FIG. 2 and FIG. 3, the at least one light-sensitive component 30 can only be disposed on a side of the OLED display element 20 away from the substrate 10, and it is need to ensure that the at least one light-sensitive component 30 is light transmissive.

Figure 5:
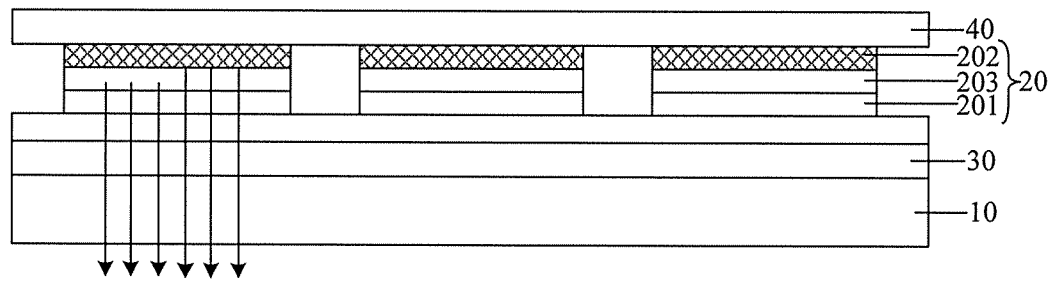
FIG. 5 is a sectional view along line BB' in FIG. 4.

For the bottom light emitting display element, as shown in FIG. 5, taking a case in which the anode 201 is disposed adjacent to the substrate 10 and the cathode 202 is disposed away from the substrate 10 as an example, the anode 201 is light transmissive, and the cathode 202 is not light transmissive. In this way, a part of the light emitted from the light emitting layer of the organic material function layer 203 directly emits through the anode 201, and another part of the light emitted from the light emitting layer of the organic material function layer 203 emits through the cathode 201 after being reflected by the cathode 202.

Figure 4:
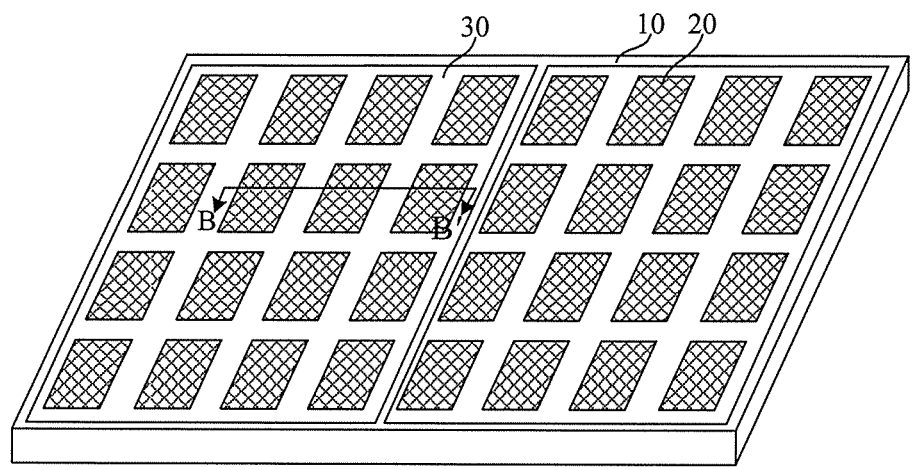
FIG. 4 is a third top view of an OLED display device according to some embodiments of the present disclosure.
Figure 6:
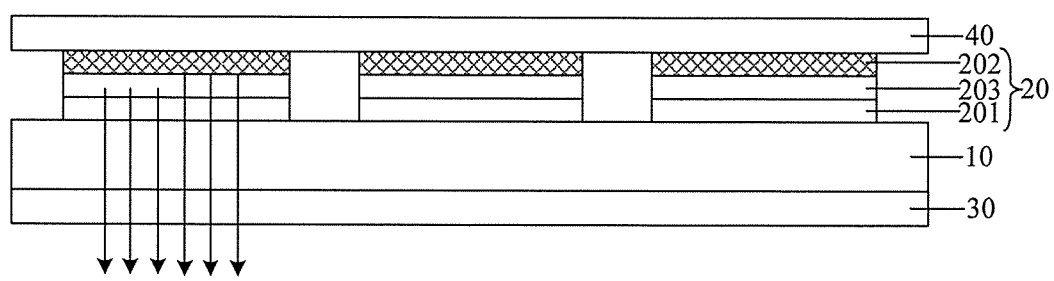
FIG. 6 is a first schematic cross-sectional view of an OLED display device according to some embodiments of the present disclosure.

In this case, the at least one light-sensitive component 30 can be disposed on a light emitting side of the OLED display element 20. Based on this, as shown in FIG. 4 and FIG. 5, the at least one light-sensitive component 30 can be disposed between the substrate 10 and the OLED display element 20; or, as shown in FIG. 6, the at least one light-sensitive component 30 can be disposed on the side of the substrate 10 away from the OLED display element 20. And it needs to ensure that the at least one light-sensitive component 30 is light transmissive.

Figure 7:
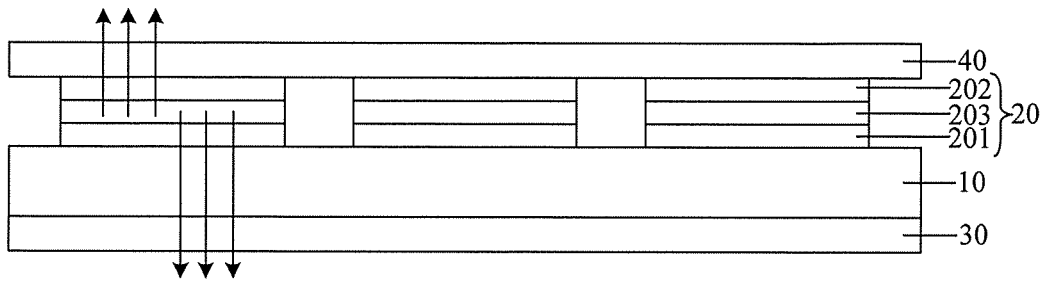
FIG. 7 is a second schematic cross-sectional view of an OLED display device according to some embodiments of the present disclosure.
Figure 8:
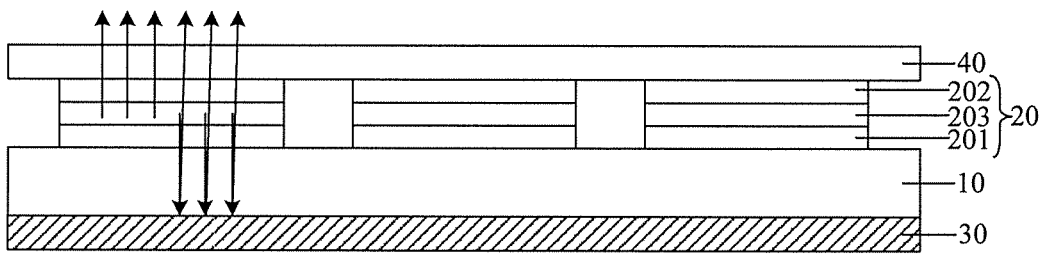
FIG. 8 is a third schematic cross-sectional view of an OLED display device according to some embodiments of the present disclosure.

For the double-sided light emitting display element, as shown in FIG. 7 and FIG. 8, taking a case in which the anode 201 is disposed adjacent to the substrate 10 and the cathode 202 is disposed away from the substrate 10 as an example, the anode 201 is light transmissive, and the cathode 202 is light transmissive or semi-transmissive. In this way, the light emitted from the organic material functional layer 203 emits through the anode 201 and the cathode 202, respectively.

In this case, the at least one light-sensitive component 30 can be disposed on one of the at least one light emitting side of the OLED display element 20. Specifically, the at least one light-sensitive component 30 can be disposed on the side of the OLED display element 20 away from the substrate 10, and can be disposed between the substrate 10 and the OLED display element 20, of cause, can also be disposed on the side of the substrate 10 away from the OLED display element 20. The at least one light-sensitive component 30 can be either light transmissive or not light transmissive.

When the at least one light-sensitive component 30 is disposed on the side of the OLED display element 20 away from the substrate 10, if the light-sensitive component 30 is light transmissive, the OLED display device is also the double-sided light emitting display device. If the light-sensitive component 30 is not light transimissive, although the OLED display element can emit light from both sides of the OLED display element 20, light emitted to the at least one light-sensitive component 30 can be reflected by the at least one light-sensitive component 30, therefore, for the OLED display device, it is a bottom lighting emitting display device.

When the at least one light-sensitive component 30 is disposed between the substrate 10 and the OLED display element 20, or is disposed on the side of the substrate 10 away from the OLED display element 20, if the at least one light-sensitive component 30 is light transimissive, the OLED display device is also the double-sided light emitting display device (refer to FIG. 7). If the light-sensitive component 30 is not light transimissive, although the OLED display element 20 can emit light from the both sides of the OLED display element 20, the light emitted to the at least one light-sensitive component 30 can be reflected by the at least one light-sensitive component 30, therefore, for the OLED display device, it is a top lighting emitting display device (refer to FIG. 8).

Based on the above, the at least one light-sensitive component 30 can include one light-sensitive component 30 or a plurality of light-sensitive components. As shown in FIG. 1 and FIG. 4, when the at least one light-sensitive component 30 includes a plurality of light-sensitive components, the a plurality of light-sensitive components should corresponding to different regions of the display area of the substrate 10 (In FIG. 1, take four regions as an example, and in FIG. 4, take two regions as an example). In this way, when performing the luminance compensation on the OLED display element, the luminance compensation can be performed on a plurality of display sub-elements of the OLED display element 20 in a region corresponding to each of the a plurality of light-sensitive components respectively. It should be understood by those skilled in the art that, since the luminance compensation can be performed on the a plurality of display sub-elements of the OLED display element 20 in the region corresponding to each of the a plurality of light-sensitive components respectively, a display luminance of the OLED display device can be more uniform.

When the at least one light-sensitive component 30 includes one light-sensitive component, and the OLED display element 20 includes the a plurality of display sub-elements, the light-sensitive component can correspond to a part of the display sub-elements of the display area of the substrate 10, or cover the display area of the substrate 10 and correspond to all of the display sub-elements (as shown in FIG. 3).

It should be noted that, firstly, a structure and an arrangement location of the at least one light-sensitive component 30 are not limited, as long as a luminance of the light emitted by the OLED display element 20 can be detected. An identification result outputted by the at least one light-sensitive component 30 can a value of the luminance, or a voltage value or a current value representing the luminance characterized, as long as the value of the luminance can be obtained after conversion.

When the at least one light-sensitive component 30 is disposed on the at least one light emitting side of OLED display element 20, and light emitted by the OLED display element 20 emit by the at least one light-sensitive component 30, the at least one light-sensitive component 30 should has high transmittance.

Secondly, the controller 50 is not limited, it can use a current function module which is used to control the OLED display element 20 to emit light, and only a unit for calculating the value of the luminance compensation can be integrated therein.

Furthermore, those skilled in the art should understand that, a step of detecting that the at least one light-sensitive component 30 detect the luminance of the light emitted by the OLED display element 20 should be separated from a display phase of the OLED display device, in this way, an image displayed at the display phase can be the image after the luminance compensation.

The embodiments of the present disclosure provide the OLED display device, in which the controller 50 control the OLED display element 20 to emit the light by arranging the at least one light-sensitive component 30 at the light emitting side of the OLED display element 20, and the luminance compensation on the OLED display element 20 can be achieved detecting an actual luminance of the light emitted by the OLED display element 20 by the at least one light-sensitive component 30, thereby, it is able to improve the uniformity of the display luminance of the OLED display device and improve the display effect.

Optionally, referring to FIG. 1 and FIG. 4, the at least one light-sensitive component 30 includes a plurality of light-sensitive components corresponding to the different regions of the display area 10 respectively.

That is, all of the OLED display element 20 in the display area of the substrate 10 can be grouped by region, the OLED display element 20 of each group locate in one region of the display area of the substrate 10, one of the plurality of light-sensitive components 30 corresponding to one region of the display area.

Since each of the plurality of light-sensitive components 30 can detect the luminance of the light emitted by the OLED display element 20 in the region corresponding to it respectively, the controller 50 can perform the luminance compensation on the plurality of display sub-elements of the OLED display element 20 of the region corresponding to each of the plurality of light-sensitive components, thereby the display luminance of the OLED display device is more uniform and the display effect is better.

Optionally, when the at least one light-sensitive component 30 is disposed on the light emitting side of the OLED display element 20, as shown in FIG. 2, FIG. 5, FIG. 6 and FIG. 7, the at least one light-sensitive component 30 is light transimissive. Based on this, the at least one light-sensitive component 30 can be applied to OLED display element 20 of any light emitting type, as long as the at least one light-sensitive component 30 is disposed on the at least one light emitting side of the OLED display element 20.

Considering that a transmittance of light will be more or less affected when the at least one light-sensitive component 30 is light transimissive, therefore, according to one embodiment of the present disclosure, as shown in FIG. 8, the OLED display element 20 is the double-sided light emitting display element. The at least one light-sensitive component 30 is disposed on one of the at least one light emitting side of the OLED display element 20, and the at least one light-sensitive component 30 is not light transimissive.

Based on this, since the light emitted by the OLED display device includes two parts, one part of the light is directly emitted from the side of the OLED display element 20 away from the at least one light-sensitive component 30, another part of the light is emitted from the OLED display element 20 toward the at least one light-sensitive component 30, and reflected by the at least one light-sensitive component 30 and then emitted. In this way, on the one hand, a light emitting luminance of the OLED display device can be improved, and on the other hand, a influence of the at least one light-sensitive component 30 on the light transmittance can be avoided.

Taking the simplification of the process into account, optionally, the at least one light-sensitive component 30 is disposed on a package substrate 40 when the at least one light-sensitive component 30 is disposed on the side of the OLED display element 20 away from the substrate 10. The at least one light-sensitive component 30 is disposed on the side of the substrate 10 away from the OLED display element 20 when the at least one light-sensitive component 30 is disposed on the side of the OLED display element 20 away from the package substrate 40.

For a function of the package substrate 40, it is mainly used to make the OLED display element 20 isolated from the outside considering the particularity of the material of the organic material functional layer 203 in the OLED display element 20.

Specifically, as shown in FIG. 6, when the OLED display element 20 is the bottom light emitting display element, the at least one light-sensitive component 30 is disposed on the side of the substrate 10 away from the OLED display element 20. In this case, the at least one light-sensitive component 30 is not transimissive. Or, as shown in FIG. 7 and FIG. 8, when the OLED display element 20 is the double-sided light emitting display element, the at least one light-sensitive component 30 can be disposed on the one side of the substrate 10 away from the OLED display element 20. And in this case, the at least one light-sensitive component 30 can be light transimissive as shown in FIG. 7, and can also be not transimissive as shown in FIG. 8.

As shown in FIG. 2, when the OLED display element 20 is the top light emitting display element, the at least one light-sensitive component 30 is disposed on the package substrate 40. In this case, the at least one light-sensitive component 30 can be light transimissive as shown in FIG. 2. The at least one light-sensitive component 30 can be disposed on the side of the package substrate 40 away from the OLED display element 20 as shown in FIG. 2, and can also be disposed on the side of the package substrate 40 facing the OLED display element 20. Or, when the OLED display element 20 is a double-sided light emitting display element, the at least one light-sensitive component 30 can be disposed on the package substrate 40. And in this case, the at least one light-sensitive component 30 can be either light transimissive or not light transimissive.

Based on the above, the at least one light-sensitive component can be a photodiode. The photodiode may be PN junction type, PIN junction type, avalanche type, Schottky type etc.

The photodiode can convert light into a current or a voltage signal, and the controller can obtain the value of luminance of the light corresponding to the current or the voltage signal according to the current or the voltage signal outputted by the photodiode.

The photodiode is easier to manufacture and less costly comparing with other types of light-sensitive components.

Optionally, the OLED display device also includes a switching thin film transistor and a driving thin film transistor both disposed between the substrate 10 and the OLED display element 20. A gate of the switching thin film transistor is electrically connected to a gate line, a source of the switching thin film transistor is electrically connected to a data line, and a drain of the switching thin film transistor is electrically connected to a gate line of the driving thin film transistor. A drain of the driving thin film transistor is electrically connected to an anode 201 of the OLED display element 20.

Based on this, when a scan signal is input to the gate line, and a data signal is input to the data line, the switching thin film transistor and the driving thin film transistor can both be turned on. On the basis of this, after a voltage is inputted into a source of the driving thin film transistor, the OLED display element 20 can be driven to emit light.

In the embodiments of the present disclosure, two thin film transistors are used to drive the OLED display element 20 to emit the light, thereby it is easy to achieve a high PPI (Pixels Per Inch) of the OLED display device.

Figure 9:
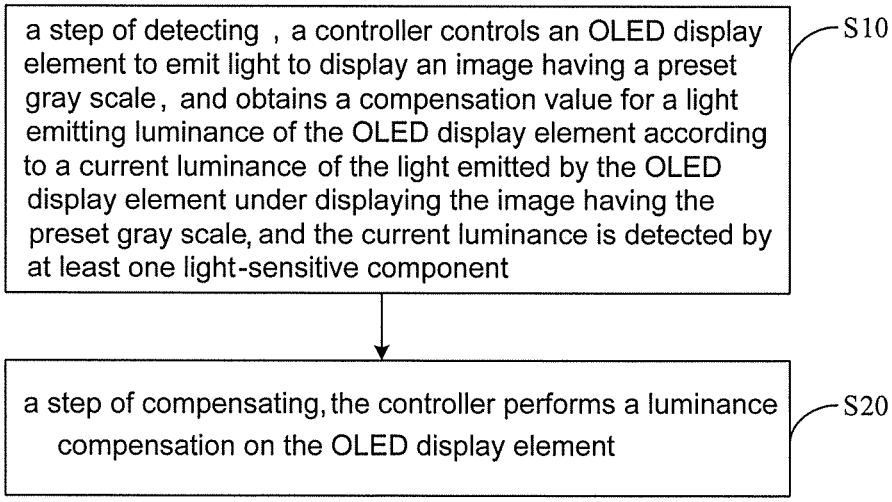
FIG. 9 is a flowchart of a luminance adjusting method of an OLED display device according to some embodiments of the present disclosure.

The embodiments of the present disclosure further provide a luminance adjustment method of an OLED display device. As shown in FIG. 9, the luminance adjustment method of the OLED display device includes:

S10, a step of detecting, wherein, a controller controls an OLED display element 20 to emit light to display an image having a preset gray scale, and obtains a compensation value for a light emitting luminance of the OLED display element 20 according to a current luminance of the light emitted by the OLED display element 20 under displaying the image having the preset gray scale, and the current luminance is detected by at least one light-sensitive component 30.

S20, a step of compensating, wherein, the controller performs a luminance compensation on the OLED display element 20 according to the compensation value.

It should be noted that, those skilled in the art should understand that, in the step of detecting, the at least one light-sensitive component 30 detect the luminance emitted by the OLED display element 20 should be separated from a display phase of the OLED display device. In this way, an image displayed at the display phase can be a luminance compensated image.

Based on this, when the controller controls the OLED display element 20 to emit light to display the image having the preset gray scale, the image at this time should be an image used for the detection of the luminance detection and it should be distinguished from a normal display image.

The embodiments of the present disclosure provide the luminance adjustment method of the OLED display device. The controller control the OLED display element 20 to emit light to display the image having the preset gray scale, and the compensation value for the light emitting luminance of the OLED display element 20 is obtained according to the current luminance of the light emitted by the OLED display element 20 under displaying the image having the preset gray scale, and the current luminance is detected by the at least one light-sensitive component 30. And the luminance compensation is performed on the OLED display element 20 according to the compensation value, thereby it is able to improve the uniformity of the display luminance of the OLED display device and improve the display effect.

Figure 10:
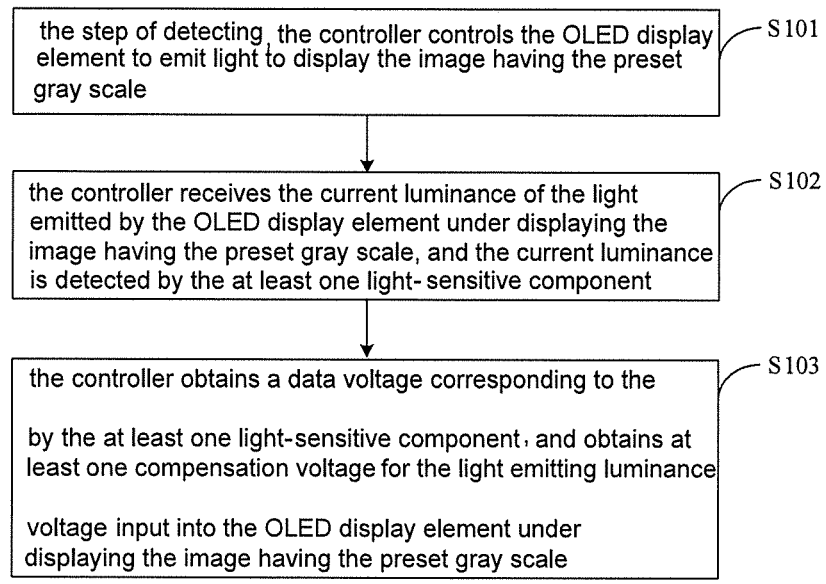
FIG. 10 is a flowchart of a step of detecting according to some embodiments of the present disclosure.

According to one embodiment of the present disclosure, as shown in FIG. 10, S10 described above, specifically includes:

S101, the step of detecting, the controller controls the OLED display element 20 to emit light to display the image having the preset gray scale.

Here, for example, the image having the preset gray scale can be a black image or a white image.

S102, the controller receives the current luminance of the light emitted by the OLED display element 20 under displaying the image having the preset gray scale, and the current luminance is detected by the at least one light-sensitive component 30.

S103, the controller obtains a data voltage (recorded as V') corresponding to the current luminance according to the current luminance detected by the at least one light-sensitive component 30, and obtains at least one compensation voltage (recorded as ΔV) for the light emitting luminance of the OLED display element 20 according to a theoretical data voltage (recorded as V) inputted into the OLED display element 20 under displaying the image having the preset gray scale.

That is, ΔV=V−V'. On the basis of this, the at least one compensation voltage can be stored.

Herein, a mapping table of the theoretical data voltage inputted into the OLED display element 20 and a theoretical light emitting luminance (that is, the theoretical data voltage inputted into the OLED display element 20 has a one to one correspondence with the theoretical light emitting luminance) can be stored in the controller. When the controller has obtained the current luminance (regarded as L') detected by the at least one light-sensitive component 30, the controller can obtain the V' corresponding to the L' by searching the mapping table. On the basis of this, the controller can obtain ΔV by performing a difference operation between V' and V.

Furthermore, performing the luminance compensation on the OLED display element 20, specifically includes:

When the OLED display device displays normally, the at least one compensation voltage and the theoretical voltage of each display sub-element of the OLED display element 20 are input to the OLED display element 20 while displaying the image when the OLED display device is displaying the image.

When the at least one light-sensitive component 30 includes one light-sensitive component 30, the at least one compensation voltage includes one compensation voltage. The compensation voltage of each display sub-element of the OLED display element 20 is same when the OLED display device displays normally.

When the at least one light-sensitive component 30 includes a plurality of light-sensitive components 30, the at least one compensation voltage includes a plurality of compensation voltages. Since the at least one compensation voltage is calculated based on a detection result of the light-sensitive component 30, the plurality of light-sensitive components 30 are in one to one correspondence with the a plurality of compensation voltages. Each of the plurality of light-sensitive components 30 also corresponds to one region of a display area, so the plurality of compensation voltages are in one to one correspondence with regions of the display area. For example, if the display area is divided into eight regions, there are eight compensation voltages corresponding to the eight regions one to one. On the basis of this, for any one region of the display area, the controller performs the luminance compensation on a plurality of display sub-elements of the OLED display element 20 in the region of the display area according to one of the plurality of compensation voltages corresponding to the region.

Comparing with the number of the at least one light-sensitive component 30 is one, when the number of the at least one light-sensitive component 30 is a plurality of, since each of the at least one light-sensitive component 30 can detect the luminance of the light emitted by the OLED display element 20 in the region corresponding to it respectively, the controller can perform the luminance compensation on the plurality of display sub-elements of the OLED display element 20 in each region corresponding to the each of the at least one light-sensitive component 30. In this way, the display luminance of the OLED display device becomes more uniform and the display effect becomes better.

Based on the above, since the factory setting, the startup and the shutdown are separated from the normal display phase, the step of detecting described above can be performed at the time of the factory setting, the startup or the shutdown.

Figure 11:
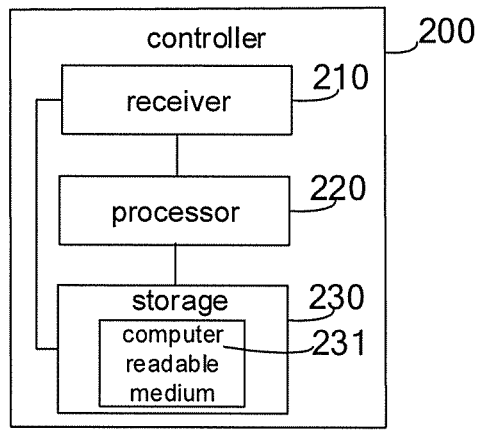
FIG. 11 is a schematic diagram of a controller according to some embodiments of the present disclosure.

The embodiments of the present disclosure further provide a controller 200 of the OLED display device as described above. As shown in FIG. 11, the controller 200 includes a processor 220 and a receiver 210. The processor 220 is configured to control an OLED display element to emit light to display an image having a preset gray scale. The receiver 210 is configured to receive a current luminance of the light emitted by the OLED display element under displaying the image having the preset gray scale, and the current luminance is detected by at least one light-sensitive component. The processor 220 is configured to obtain a compensation value for a light emitting luminance of the OLED display element according to the current luminance, and to perform a luminance compensation on the OLED display element according to the compensation value. Optionally, the controller 200 further includes a storage 230 configured to store programs or a corresponding data. The storage 230 further includes computer readable medium 231.

Optionally, the processor 220 is configured to control the OLED display element to emit light to display the image having the preset gray scale. The receiver 210 is configured to receive the current luminance of the light emitted by the OLED display element under displaying the image having the preset gray scale, and the current luminance is detected by the at least one light-sensitive component. The processor 220 is configured to obtain a data voltage corresponding to the current luminance received by the receiver according to the current luminance, and to obtain at least one compensation voltage for the light emitting luminance of the OLED display element according to a theoretical data voltage inputted into the OLED display element under displaying the image having the preset gray scale.

Further optionally, the at least one compensation voltage includes a plurality of compensation voltages and the plurality of compensation voltages are in one to one correspondence with regions of a display area, when the at least one light-sensitive component includes a plurality of light-sensitive components corresponding to different regions of the display area respectively.

Based on this, the processor 220 is configured to perform the luminance compensation on a plurality of display sub-elements of the OLED display element in any one region of the display area according to one of the plurality of compensation voltages corresponding to the region.

Optionally, a mapping table of the theoretical data voltage inputted into the OLED display element and a theoretical light emitting luminance is stored in the processor.

Basing on this, the processor 220 is configured to obtain the data voltage corresponding to the current luminance by searching the mapping table according to the current luminance detected by the at least one light-sensitive component. The processor 220 is further configured to obtain the at least one compensation voltage for the light emitting luminance of the OLED display element by performing a difference operation according to the theoretical data voltage inputted into the OLED display element under displaying the image having the preset gray scale and the data voltage corresponding to the current luminance.

Basing on the above, optionally, the image having the preset gray scale is a black image or a white image.

Optionally, the step of detecting is performed at the time of factory setting, or at the time of startup or at the time of shutdown.

The embodiments of the present disclosure further provide a computer readable medium 231 as shown in FIG. 11. A computer program is stored in the computer readable medium 231. When the program is executed by the processor, the following steps are implemented.

An OLED display element is controlled to emit light to display an image having an preset gray scale, and obtains a compensation value for a light emitting luminance of the OLED display element according to a current luminance of the light emitted by the OLED display element under displaying the image having the preset gray scale, and the current luminance is detected by at least one light-sensitive component.

A luminance compensation is performed on the OLED display element 20 according to the compensation value.

The embodiments of the present disclosure further provide a computer program. When the program is executed by the processor, the following steps are implemented.

An OLED display element is controlled to emit light to display an image having a preset gray scale, and obtain a compensation value for a light emitting luminance of the OLED display element according to a current luminance of light emitted by the OLED display element under displaying the image having preset gray scale, and the current luminance is detected by at least one light-sensitive component;

A luminance compensation is performed on the OLED display element 20 according to the compensation value.

The present embodiments of the present disclosure further provide a computer program product including a program stored in a computer readable medium or a carrier wave. When the program is executed by the processor, the following steps are implemented.

An OLED display element is controlled to emit light to display an image having a preset gray scale, and obtain a compensation value for a light emitting luminance of the OLED display element according to a current luminance of light emitted by the OLED display element under displaying the image having preset gray scale, and the current luminance is detected by at least one light-sensitive component;

A luminance compensation is performed on the OLED display element 20 according to the compensation value.

The above descriptions are only the specific implementations of the present disclosure, but the protection scope of the present disclosure is not limited thereto, the changes or replacements that can be easily figured out within the technical scope disclosed by the invention by the technical personnel familiar with the technical field of the invention are all covered within the protection scope of the present disclosure. Therefore, the protection scope of the invention is subject to the protection scope of the claims.

Additional embodiments including any one of the embodiments described above may be provided by the disclosure, where one or more of its components, functionalities or structures is interchanged with, replaced by or augmented by one or more of the components, functionalities or structures of a different embodiment described above.

What is claimed is:

1. An OLED display device, comprising a substrate, OLED display elements disposed on a display area of the substrate, at least one light-sensitive component, a controller electrically connected to the at least one light-sensitive component and a package substrate disposed on a side of the OLED display elements away from the substrate, wherein:
a display area of the OLED display device includes at least one region,
the at least one light-sensitive component is disposed on at least one light emitting side of the OLED display elements, and the light emitting side is parallel to the substrate,
one of the at least one light-sensitive component corresponds to one corresponding region of the display area,
the controller is configured to control the OLED display elements to emit light, and to perform a luminance compensation on OLED display elements within a corresponding region according to a luminance of the light, which is emitted by the OLED display elements within the corresponding region, detected by the at least one light-sensitive component,
the at least one light-sensitive component is disposed on the package substrate when the at least one light-sensitive component is disposed on the side of the OLED display elements away from the substrate, and
the at least one light-sensitive component is disposed on a side of the substrate away from the OLED display elements when the at least one light-sensitive component is disposed on a side of the OLED display elements away from the package substrate.

2. The OLED display device according to claim 1, wherein the at least one light-sensitive component includes a plurality of light-sensitive components which correspond to different regions of the display area, respectively.

3. The OLED display device according to claim 1, wherein the at least one light-sensitive component is light transmissive.

4. The OLED display device according to claim 1, wherein,
the OLED display elements are a double-sided light emitting display element;
the at least one light-sensitive component is disposed on one of the at least one light emitting side of the OLED display elements, and the at least one light-sensitive component is not light transmissive.

5. The OLED display device according to claim 1, wherein each of the at least one light-sensitive component is a photodiode.

6. The OLED display device according to claim 1, further comprising a switching thin film transistor and a driving thin film transistor both disposed between the substrate and the OLED display elements, wherein
a gate of the switching thin film transistor is electrically connected to a gate line, a source of the switching thin film transistor is electrically connected to a data line, and a drain of the switching thin film transistor is electrically connected to a gate of the driving thin film transistor; and
a drain of the driving thin film transistor is electrically connected to an anode of the OLED display elements.

7. A luminance adjustment method of an OLED display device according to claim 1, comprising:
a step of detecting, which is configured to control the OLED display elements to emit light to display an image having a preset gray scale, and configured to obtain a compensation value for a light emitting luminance of the OLED display elements within the corresponding region according to a current luminance of the light emitted by the OLED display elements under displaying the image having the preset gray scale, the current luminance being detected by the at least one light-sensitive component; and
a step of compensating, which is configured to perform a luminance compensation on the OLED display elements within the corresponding region according to the compensation value.

8. The luminance adjustment method according to claim 7, wherein controlling the OLED display elements to emit the light to display the image having the preset gray scale, and obtaining the compensation value for the light emitting luminance of the OLED display elements within the corresponding region according to the current luminance of the light emitted by the OLED display elements under displaying the image having the preset gray scale, and the current luminance being detected by the at least one light-sensitive component comprises:
- controlling the OLED display elements to emit light to display the image having the preset gray scale;
- receiving the current luminance of the light emitted by the OLED display elements within the corresponding region under displaying the image having the preset gray scale, the current luminance being detected by the at least one light-sensitive component; and
- obtaining a data voltage corresponding to the current luminance detected by the at least one light-sensitive component according to the current luminance, and obtaining at least one compensation voltage for the light emitting luminance of the OLED display elements within the corresponding region according to a theoretical data voltage input into the OLED display elements within the corresponding region under displaying the image having the preset gray scale, and the data voltage corresponding to the current luminance.

9. The luminance adjustment method according to claim 8, wherein the at least one light-sensitive component comprises a plurality of light-sensitive components corresponding to different regions of the display area respectively, and the at least one compensation voltage comprises a plurality of compensation voltages and the plurality of compensation voltages are in one-to-one correspondence with regions of a display area;
- performing the luminance compensation on the OLED display elements within the corresponding region comprises:
- performing the luminance compensation on a plurality of display sub-elements of the OLED display elements in any one region of the display area according to one of the plurality of compensation voltages corresponding to the region.

10. The luminance adjustment method according to claim 8, wherein the luminance adjustment method further comprises: storing a mapping table of the theoretical data voltage input into the OLED display elements and a theoretical light emitting luminance, and
- obtaining the data voltage corresponding to the current luminance according to the current luminance detected by the at least one light-sensitive component, and obtaining the at least one compensation voltage for the light emitting luminance of the OLED display elements within the corresponding region according to the theoretical data voltage input into the OLED display elements within the corresponding region under displaying the image having the preset gray scale and the data voltage corresponding to the current luminance comprises:
- searching the mapping table according to the current luminance detected by the at least one light-sensitive component to obtain the data voltage corresponding to the current luminance; and
- performing a difference operation according to the theoretical data voltage input into the OLED display elements within the corresponding region under displaying the image having the preset gray scale and the data voltage corresponding to the current luminance to obtain the at least one compensation voltage for the light emitting luminance of the OLED display elements.

11. The luminance adjustment method according to claim 7, wherein the image having the preset gray scale is a black image or a white image.

12. The luminance adjusting method according to claim 7, wherein the step of detecting is performed at a time of factory setting, at a time of startup or at a time of shutdown.

13. A non-transitory computer-readable medium storing computer programs that, when loaded to and executed by a processor, cause the processor to perform the luminance adjustment method of an OLED display device according to claim 7.

14. A controller of the OLED display device according to claim 1, comprising: a processor and a receiver, wherein
- the processor is configured to control an OLED display elements within the corresponding region to emit light to display an image having a preset gray scale;
- the receiver is configured to receive a current luminance of the light emitted by the OLED display elements within the corresponding region under displaying the image having the preset gray scale, the current luminance being detected by the at least one light-sensitive component; and
- the processor is configured to obtain a compensation value for a light emitting luminance of the OLED display elements within the corresponding region according to the current luminance, and to perform a luminance compensation on the OLED display element according to the compensation value.

* * * * *